(12) United States Patent
Lu et al.

(10) Patent No.: US 7,977,993 B2
(45) Date of Patent: Jul. 12, 2011

(54) SIGNAL DELAY CIRCUIT

(75) Inventors: Hung-Wen Lu, Pingjhen (TW); Chau-Chin Su, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/123,613

(22) Filed: May 20, 2008

(65) Prior Publication Data

US 2009/0167399 A1 Jul. 2, 2009

(30) Foreign Application Priority Data

Dec. 31, 2007 (TW) ................. 96151616 A

(51) Int. Cl.
*H03H 11/26* (2006.01)
(52) U.S. Cl. ........................................ 327/264; 327/261
(58) Field of Classification Search .................. 327/261, 327/263, 264, 407, 408, 410; 326/23, 24, 326/26–28, 93, 95–96, 104, 106, 408
See application file for complete search history.

(56) References Cited

U.S. PATENT DOCUMENTS

| | | | |
|---|---|---|---|
| 4,737,670 A | 4/1988 | Chan | |
| 4,899,071 A | 2/1990 | Morales | |
| 4,994,695 A | 2/1991 | Bazes | |
| 5,012,142 A | 4/1991 | Sonntag | |
| 5,036,294 A | 7/1991 | McCaslin | |
| 5,130,564 A | 7/1992 | Sin | |
| 5,179,303 A | 1/1993 | Searles et al. | |
| 5,180,991 A | 1/1993 | Takashima | |
| 5,231,319 A | 7/1993 | Crafts et al. | |
| 5,233,316 A | 8/1993 | Yamada et al. | |
| 5,281,927 A | 1/1994 | Parker | |
| 5,283,631 A | 2/1994 | Koerner et al. | |
| 5,302,920 A | 4/1994 | Bitting | |
| 5,334,891 A | 8/1994 | Marbot | |
| 5,349,311 A | 9/1994 | Mentzer | |
| 5,365,128 A | 11/1994 | Bazes | |
| 5,416,436 A | 5/1995 | Rainard | |
| 5,506,534 A | 4/1996 | Guo et al. | |
| 5,544,203 A | 8/1996 | Casasanta et al. | |
| 5,559,452 A * | 9/1996 | Saito | 326/88 |
| 5,598,364 A | 1/1997 | McCall et al. | |
| 5,644,262 A | 7/1997 | Bazes | |
| 5,677,650 A | 10/1997 | Kwasniewski et al. | |
| 5,727,038 A | 3/1998 | May et al. | |
| 5,808,498 A | 9/1998 | Donnelly et al. | |
| 5,812,003 A | 9/1998 | Lee | |
| 5,864,258 A | 1/1999 | Cusinato et al. | |

(Continued)

OTHER PUBLICATIONS

Pao-Lung Chen, et al "A Clock Generator with Cascaded Dynamic Frequency Counting Loops for Wide Multiplication Range Applications" IEEE Journal of Solid-State Circuits, vol. 41, No. 6 Jun. 2006 pp. 1275-1285.

(Continued)

*Primary Examiner* — An T Luu
(74) *Attorney, Agent, or Firm* — Workman Nydegger

(57) ABSTRACT

A signal delay circuit including a capacitive load element is described. The capacitive load element has a first input end, a second input end, and a third input end. The first input end receives a first signal, the second input end receives a second signal inverted to the first signal, and the third input end receives a control signal. The capacitance of the capacitive load element changes with the control signal.

19 Claims, 17 Drawing Sheets

U.S. PATENT DOCUMENTS

| | | | |
|---|---|---|---|
| 5,880,612 A | 3/1999 | Kim | |
| 5,883,827 A * | 3/1999 | Morgan | 365/100 |
| 5,923,715 A | 7/1999 | Ono | |
| 5,933,039 A | 8/1999 | Hui et al. | |
| 5,959,485 A | 9/1999 | Roohparvar | |
| 6,028,488 A | 2/2000 | Landman et al. | |
| 6,133,748 A * | 10/2000 | Ternullo, Jr. | 326/21 |
| 6,204,705 B1 | 3/2001 | Lin | |
| 6,215,364 B1 | 4/2001 | Hwang et al. | |
| 6,311,050 B1 | 10/2001 | Welland et al. | |
| 6,327,463 B1 | 12/2001 | Welland | |
| 6,339,553 B1 | 1/2002 | Kuge | |
| 6,356,158 B1 | 3/2002 | Lesea | |
| 6,369,615 B1 * | 4/2002 | Shimizu et al. | 326/93 |
| 6,369,624 B1 | 4/2002 | Wang et al. | |
| 6,377,103 B1 | 4/2002 | Mooney et al. | |
| 6,535,070 B2 | 3/2003 | Hwang et al. | |
| 6,549,353 B1 * | 4/2003 | Teterud | 360/46 |
| 6,549,765 B2 | 4/2003 | Welland et al. | |
| 6,621,315 B2 | 9/2003 | Heo et al. | |
| 6,633,186 B1 | 10/2003 | Bazes | |
| 6,658,748 B1 | 12/2003 | Leipold et al. | |
| 6,760,575 B2 | 7/2004 | Welland | |
| 6,763,079 B1 | 7/2004 | Iwamoto | |
| 6,870,432 B2 | 3/2005 | Li et al. | |
| 6,894,552 B2 | 5/2005 | Iorga et al. | |
| 7,030,643 B2 * | 4/2006 | Kim | 326/27 |
| 7,042,296 B2 | 5/2006 | Hui et al. | |
| 7,068,089 B2 | 6/2006 | Soe | |
| 7,161,389 B2 * | 1/2007 | Wijeratne et al. | 326/121 |
| 7,202,726 B2 | 4/2007 | Kunanayagam et al. | |
| 2004/0021484 A1 * | 2/2004 | Dash et al. | 326/83 |
| 2007/0069305 A1 | 3/2007 | Kuboyama et al. | |
| 2008/0315966 A1 * | 12/2008 | Lu et al. | 331/167 |

OTHER PUBLICATIONS

SIPO; Office Action in related foreign application (TW 096151616) to which priority is claimed by the present application; Mar. 1, 2010.
TIPO Office Action dated Jan. 27, 2011, (4 pages).

* cited by examiner

| control code | delay time ( ps ) | | |
|---|---|---|---|
| | the present invention | FIG. 1 | FIG. 4 |
| 000 | 183.26 | 178.31 | 135.73 |
| 001 | 183.68 | 181.89 | 137.22 |
| 010 | 184.05 | 185.50 | 138.79 |
| 011 | 184.43 | 189.00 | 140.44 |
| 100 | 184.81 | 192.57 | 141.98 |
| 101 | 185.20 | 196.15 | 143.62 |
| 110 | 185.57 | 199.68 | 145.33 |
| 111 | 185.93 | 203.20 | 146.96 |
| resolution | 0.33 | 3.11 | 1.40 |

US 7,977,993 B2

SIGNAL DELAY CIRCUIT

CROSS-REFERENCE TO RELATED APPLICATIONS

This non-provisional application claims priority under 35 U.S.C. §119(a) on Patent Application No(s). 096151616 filed in Taiwan, R.O.C. on Dec. 31, 2007 the entire contents of which are hereby incorporated by reference.

BACKGROUND OF THE INVENTION

The present invention relates to a capacitive load element, and more particularly to a capacitive load element of a signal delay circuit.

A digital control clock delay circuit may be classified into an analog delay circuit and a digital delay circuit based on the architecture and adjustment mechanism.

The analog delay circuit is characterized by using the analog control signal, and generally includes a digital to analog circuit and a delay circuit. An external digital control signal is converted into an analog voltage through a digital to analog converter (DAC). The delay circuit consists of a differential pair circuit consisting of N-type or P-type transistors and different load resistors or load capacitors. Parameters, such as bias current, and load capacitance or load resistance at the output end, of the delay elements are finely adjusted to change the signal delay time. Although achieving a high resolution and high anti-noise capability, the analog delay circuit has a complicated design and a high cost. In the design of the analog delay circuit, a plurality of iterative fine adjustments of the sizes and operating points of the elements must be performed, and the circuit needs to be redesigned whenever the process is updated. The digital delay circuit directly controls the delay unit through the digital control signal, and the delay unit consists of an inverter, a transmission gate, a multiplexer, an NAND gate, an NOR gate, etc.

FIG. 1 shows a digital delay circuit in the prior art. The digital delay circuit consists of a transmission gate 10, a first inverter 11, and a second inverter 12. Referring to FIG. 1, the first inverter 11 receives a signal at an input end In, and outputs the signal through an output end Out after inverting the signal. An input end and an output end of the transmission gate 10 are directly interconnected, and then connected to the output end Out of the first inverter 11. A control end of the transmission gate 10 is controlled by a control signal Ctrl. The second inverter 12 receives the control signal Ctrl, and outputs an inverted control signal Ctrlb to another control end of the transmission gate 10.

FIG. 2 shows an equivalent circuit diagram of the transmission gate 10 in FIG. 1. The equivalent circuit consists of a PMOS transistor 13 and an NMOS transistor 14. A source and a drain of the PMOS transistor 13 are interconnected, and then connected to the output end Out of the first inverter 11. A gate of the PMOS transistor 13 receives the inverted control signal Ctrlb. Likewise, a source and a drain of the NMOS transistor 14 are also interconnected, and then connected to the output end of the first inverter 11. A gate of the NMOS transistor 14 receives the control signal Ctrl. In the figure, $C_N$ represents the capacitance of the NMOS transistor 14 at the output end, and $C_P$ represents the capacitance of the PMOS transistor 13 at the output end.

When the control signal Ctrl received by the control end of the transmission gate 10 is logic 0, no matter the logic level at the output end of the first inverter 11 is 1 or 0, the capacitance of the transmission gate 10 is equal to the sum of the capacitance of the NMOS transistor when turned off and the capacitance of the PMOS transistor when turned off.

When the control signal Ctrl received by the control end of the transmission gate 10 is logic 1, and the logic level at the output end of the first inverter 11 is 0, the capacitance at the output end of the first inverter 11 is equal to the sum of the capacitance of the NMOS transistor when turned on and the capacitance of the PMOS transistor when turned off When the logic level at the output end of the first inverter 11 is 1, the capacitance at the output end of the first inverter 11 is equal to the sum of the capacitance of the NMOS transistor when turned off and the capacitance of the PMOS transistor when turned on. FIGS. 3A and 3B are schematic views showing parasitic capacitance changes at the output end of the first inverter 11 under different control signals. FIG. 3A is a schematic view showing the capacitance changes of the PMOS transistor indicated by a curve 15 and the capacitance changes of the NMOS transistor indicated by a curve 16 when the control signal Ctrl is logic 0. FIG. 3B is a schematic view showing the capacitance changes of the PMOS transistor indicated by a curve 17 and the capacitance changes of the NMOS transistor indicated by a curve 18 when the control signal Ctrl is logic 1. As shown in the figure, the transmission delay of the circuit is increased with the increase of the parasitic capacitance due to the change of the control signal.

FIG. 4 is a schematic view of another delay circuit in the prior art. The delay circuit consists of an inverter 20 and an NAND gate 21. The inverter 20 receives a signal at an input end In, and outputs the signal through an output end Out after inverting the signal. The NAND gate 21 has a first input end, a second input end, and an output end. The first input end of the NAND gate 21 is electrically connected to the output end Out of the inverter 20, the second input end of the NAND gate 21 receives a control signal Ctrl, and the output end of the NAND gate 21 is floating.

FIG. 5 is an equivalent circuit diagram of the NAND gate 21 in FIG. 4. The equivalent circuit consists of PMOS transistors 22, 24 and NMOS transistors 23, 25. FIGS. 6A and 6B are schematic views showing parasitic capacitance changes at the output end Out of the inverter 20 under different control signals.

In FIG. 6A, when the control signal Ctrl is logic 0, a curve 26 indicates parasitic capacitance changes at the output end of the inverter 20 generated by the PMOS transistor 22, and a curve 27 indicates parasitic capacitance changes at the output end of the inverter 20 generated by the NMOS transistor 23. In FIG. 6B, when the control signal Ctrl is logic 1, a curve 28 indicates parasitic capacitance changes at the output end of the inverter 20 generated by the PMOS transistor 22, and a curve 29 indicates parasitic capacitance changes at the output end of the inverter 20 generated by the NMOS transistor 23.

When the control signal Ctrl is logic 0, no matter the logic level at the output end of the inverter 20 is 1 or 0, the NMOS transistor 23 is turned off The PMOS transistor 22 is turned on when the logic level at the output end of the inverter 20 is 0, and is turned off when the output level is 1. When the control signal Ctrl is logic 1, the capacitance of the NMOS transistor 23 changes with the output voltage, wherein the NMOS transistor 23 is turned on when the output level is 1, and turned off when the output level is 0. Likewise, the capacitance of the PMOS transistor 22 changes with the output voltage, which is almost the same as the circumstance when the control signal Ctrl is logic 0, but has the following difference. When the output voltage is neither logic 0 nor 1, the NMOS transistor 23 is temporarily turned on. Thus, the turn-on range of the PMOS transistor 22 is slightly expanded, and the capacitance changes are slightly increased. Compared with the capacitance changes of the NMOS transistor 23, the capacitance changes of the PMOS transistor 22 are negligible, and thereby a capacitance difference of the NMOS transistor 23 between the turn-on and turn-off can be generated through the control signal Ctrl. Referring to FIGS. 6A and 6B, due to the capacitance changes, the transmission delay of the circuit is increased. Further, after comparison between FIGS. 6B and 3B, the signal delay circuit in FIG. 4 has slight capacitance changes than that in FIG. 1, thus generating subtle clock delay.

SUMMARY OF THE INVENTION

Accordingly, the present invention is directed to a signal delay circuit. Compared with the conventional digital clock delay circuit, the circuit of the present invention has a higher delay time resolution, and compared with the conventional analog clock delay circuit, the circuit of the present invention takes up a smaller area and operates at a lower voltage.

In an embodiment of the present invention, a signal delay circuit including a capacitive load element is provided. The capacitive load element has a first input end, a second input end, and a third input end. The first input end receives a first signal, the second input end receives a second signal which is an inverted signal of the first signal, and the third input end receives a control signal. The capacitance of the capacitive load element changes with the control signal.

The signal delay circuit having a high clock resolution of the present invention is achieved by a digital control delay circuit. Compared with the conventional digital clock delay circuit, the circuit of the present invention has a higher delay time resolution, and compared with the conventional analog clock delay circuit, the circuit of the present invention takes up a smaller area and operates at a lower voltage.

Compared with the conventional analog design, the signal delay circuit of the present invention has a simpler design. The circuit performance is adjusted by changing the combination of the digital circuit units, instead of fine adjusting the size of each transistor. Therefore, it takes less time in redesign when the process is transferred.

The signal delay circuit of the present invention can achieve a high clock resolution both in theoretical analysis and actual simulation.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

The detailed features and advantages of the present invention will be described in detail in the following embodiments. Those skilled in the arts can easily understand and implement the content of the present invention. Furthermore, the relative objectives and advantages of the present invention are apparent to those skilled in the arts with reference to the content disclosed in the specification, claims, and drawings. The embodiments below are only used to illustrate the features of the present invention, instead of limiting the scope of the same.

Figure 7A:
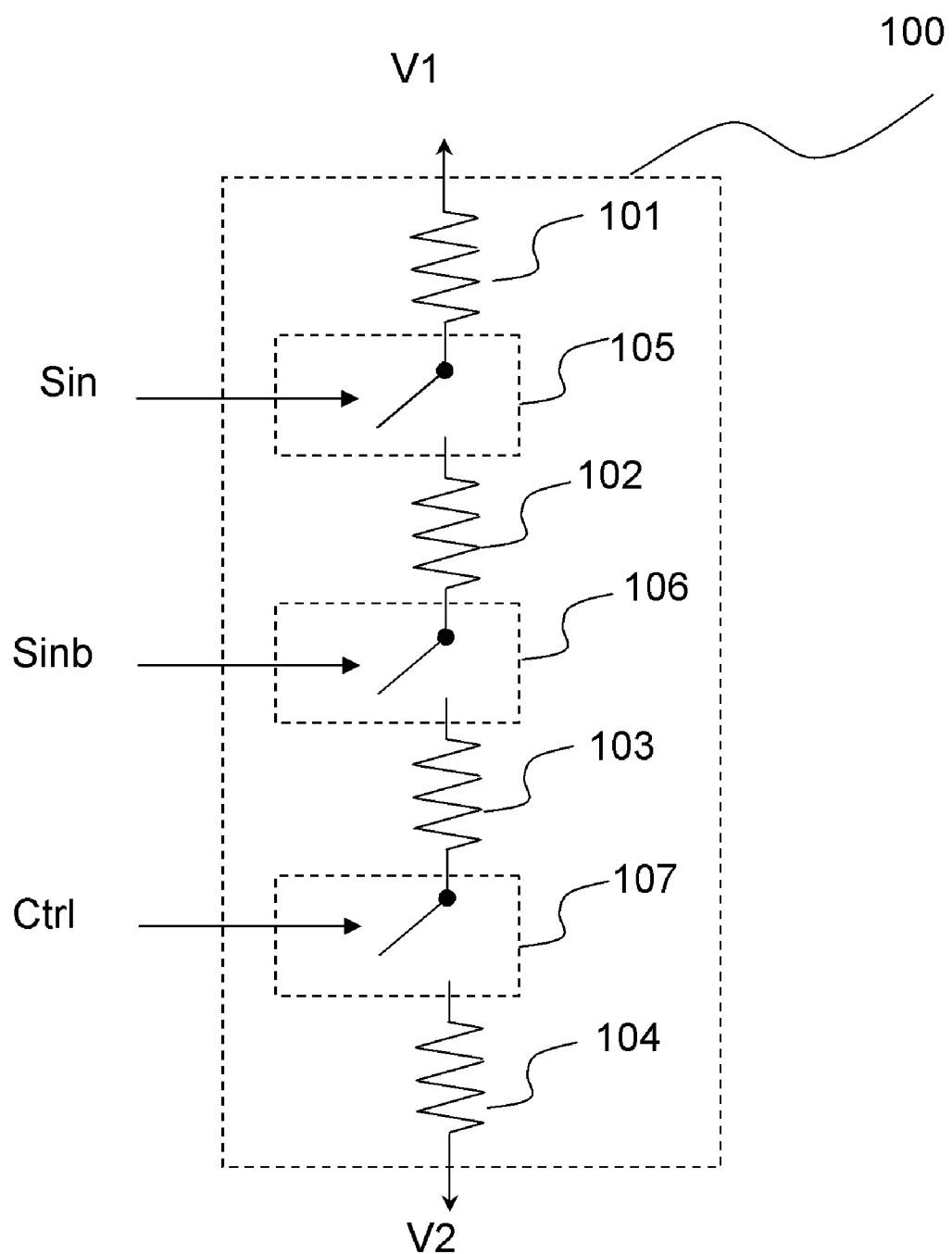
FIGS. 7A and 7B are schematic views of a signal delay circuit according to an embodiment of the present invention respectively.
Figure 7B:
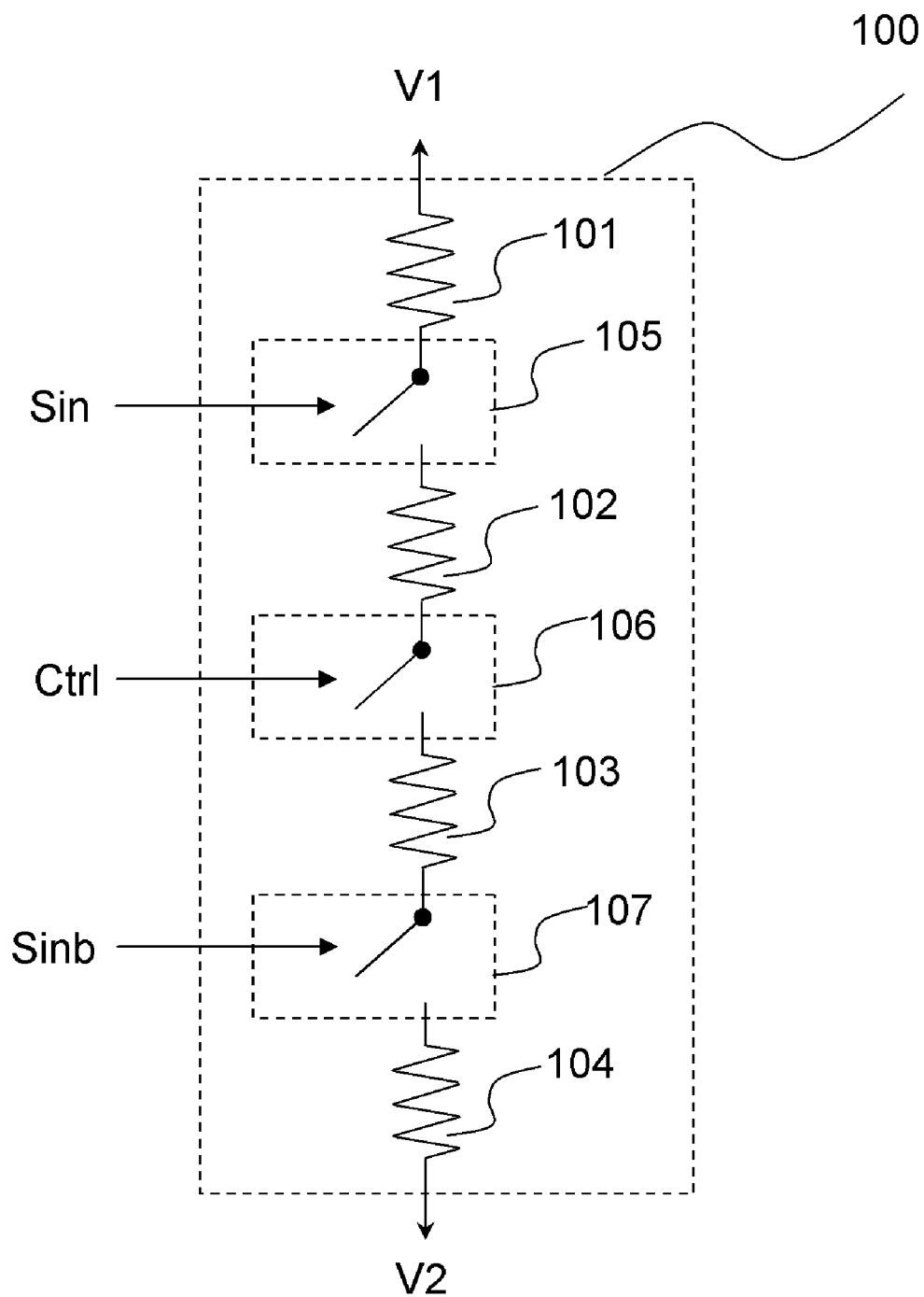

Referring to FIGS. 7A and 7B, schematic views of a signal delay circuit according to an embodiment of the present invention are shown respectively. In an embodiment, the signal delay circuit consists of a capacitive load element which is a logic gate 100 having three input ends in this embodiment. The logic gate 100 at least consists of three switches 105, 106, and 107. In an embodiment, transistors are selected to serve as the switches 105, 106, and 107. In the figures, the resistors are parasitic resistors 101, 102, 103, and 104 equivalent to other active or passive elements in the logic gate. The voltages V1, V2 are source voltages or ground voltages.

In the embodiment of FIG. 7A, the switch 105 receives a first signal Sin, the switch 106 receives a second signal Sinb, and the switch 107 receives a control signal Ctrl. The first signal Sin is an inverted signal of the second signal Sinb. In an embodiment, an inverter is used to generate the first signal Sin and the second signal Sinb. In another embodiment, two inverters are used to generate the first signal Sin and the second signal Sinb by means of differential signals.

In the embodiment of FIG. 7B, the switch 105 receives a first signal Sin, the switch 106 receives a control signal Ctrl, and the switch 107 receives a second signal Sinb. The first signal Sin is an inverted signal of the second signal Sinb. In an embodiment, an inverter is used to generate the first signal Sin and the second signal Sinb. In another embodiment, two inverters are used to generate the first signal Sin and the second signal Sinb by means of differential signals.

Figure 8A:
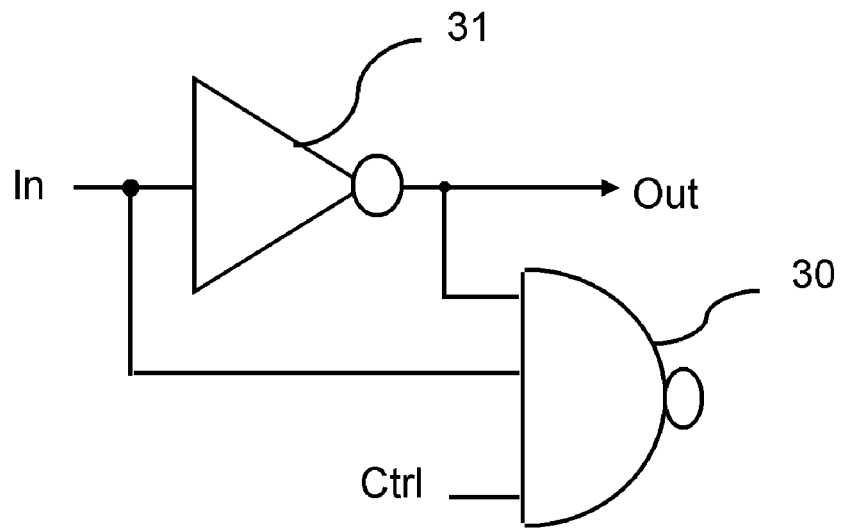
FIG. 8A is a schematic view of a delay circuit according to a first embodiment of the present invention.

Referring to FIG. 8A, a schematic view of a signal delay circuit according to an embodiment of the present invention is shown. In an embodiment, the signal delay circuit consists of a capacitive load element which is an NAND gate 30 in this embodiment. The NAND gate 30 has a first input end, a second input end, a third input end, and an output end. The first input end of the NAND gate 30 receives a first signal, and the second input end of the NAND gate 30 receives a second signal. The first signal is an inverted signal of the second signal. In this embodiment, the first signal and the second signal are generated by an inverter 31, the first signal is received by an input end In of the inverter 31, and the second signal is output by an output end Out of the inverter 31. The first input end of the NAND gate 30 is electrically connected to the input end of the inverter 31 for receiving the first signal. The second input end of the NAND gate 30 is electrically connected to the output end of the inverter 31 for receiving the second signal. The third input end of the NAND gate 30 receives a control signal Ctrl. The output end of the NAND gate 30 is floating.

In this embodiment, the second signal is an inverted signal of the first signal. The first signal is received by the input end In of the inverter 31, and is inverted by the inverter 31. Thereafter, an inverted signal is output by the output end Out of the inverter 31 to serve as the second signal.

Figure 8B:
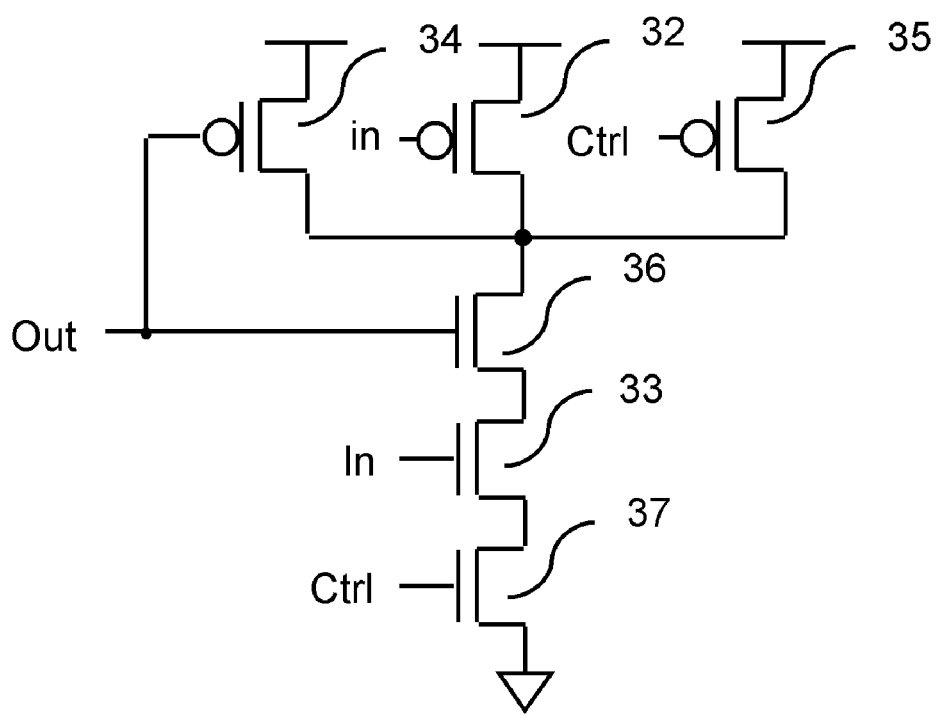
FIG. 8B is an equivalent circuit diagram of the delay circuit in FIG. 8A.

FIG. 8B is an equivalent circuit diagram of the NAND gate 30 in FIG. 8A. Gates of a PMOS transistor 32 and an NMOS transistor 33 represent the first input end of the NAND gate 30. Gates of a PMOS transistor 34 and an NMOS transistor 36 represent the second input end of the NAND gate 30. Gates of a PMOS transistor 35 and an NMOS transistor 37 represent the third input end of the NAND gate 30.

Figure 9A:
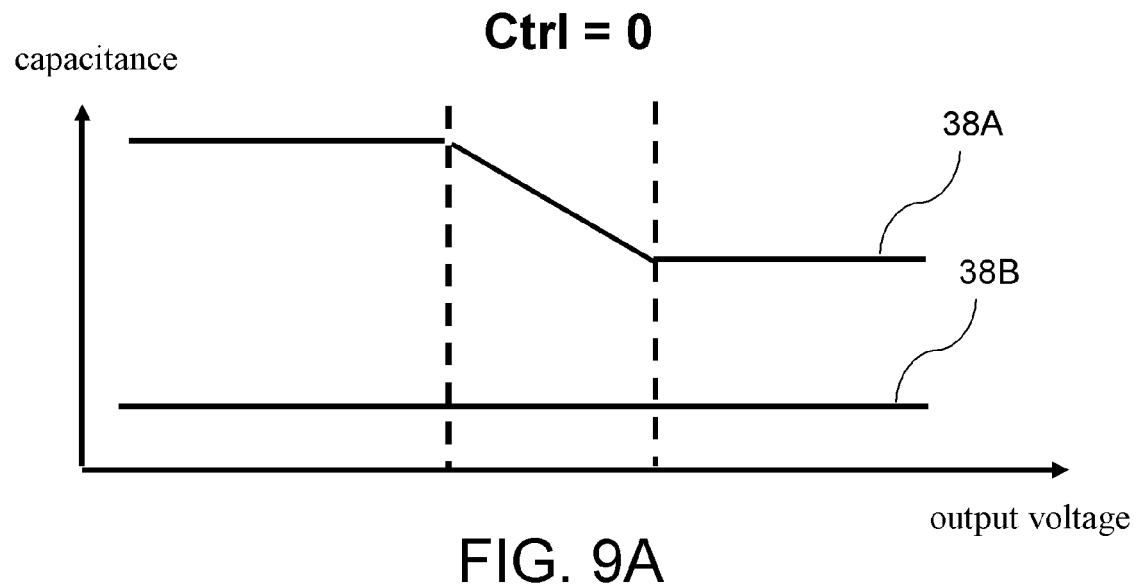
FIGS. 9A and 9B are schematic views showing capacitance changes of the delay circuit in FIG. 8A under different control signals.
Figure 9B:
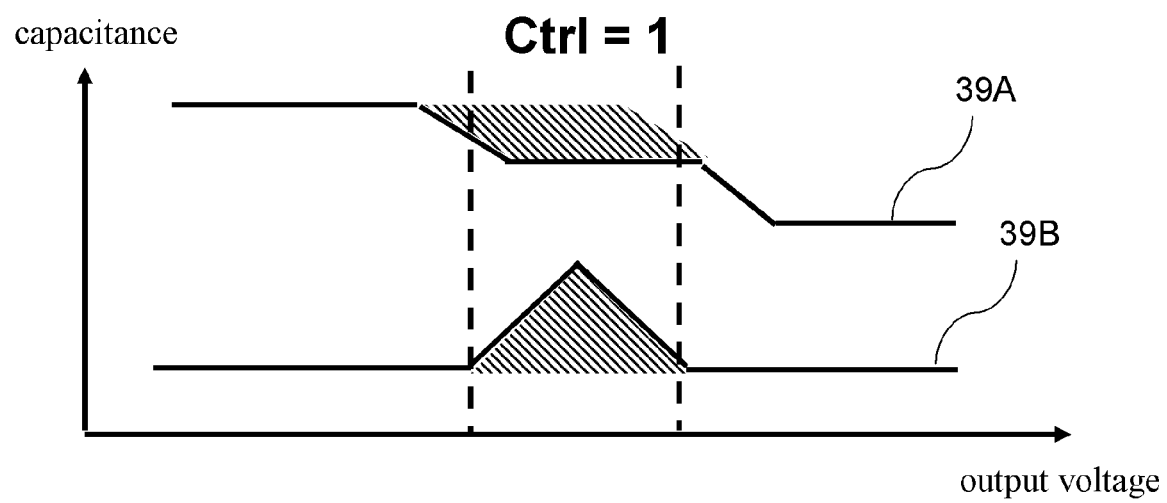

FIGS. 9A and 9B are schematic views showing parasitic capacitance changes at the output end Out of the inverter 31 caused by the NAND gate 30 under different control signals. In FIG. 9A, when the control signal Ctrl is logic 0, a curve 38A indicates capacitance changes of the PMOS transistor 34, and a curve 38B indicates capacitance changes of the NMOS transistor 36. In FIG. 9B, when the control signal Ctrl is logic 1, a curve 39A indicates capacitance changes of the PMOS transistor 34, and a curve 39B indicates capacitance changes of the NMOS transistor 36.

When the control signal Ctrl is logic 0, no matter the logic level at the output end of the inverter 31 is 1 or 0, the PMOS transistor 35 is turned on, and the NMOS transistor 37 is turned off. Thus, the output logic level of the NAND logic gate 30 is always 1, and the PMOS transistor 34 is turned on when the logic level at the output end of the inverter 31 is 0 and is turned off when the output level of the inverter 31 is 1. Due to the output logic level of the NAND logic gate 30 is 1, the NMOS transistor 36 cannot be turned on no matter the logic level at the output end of the inverter 31 is 1 or 0. When the control signal Ctrl is logic 1, the PMOS transistor 35 is turned off, and the NMOS transistor 37 is turned on. Moreover, the capacitance of the PMOS transistor 34 changes with the output voltage, which is almost the same as the circumstance when the control signal Ctrl is logic 0, but has the following difference. When the output voltage is neither logic 0 nor 1, the NMOS transistor 36 is slightly turned on, such that the turn-on range of the PMOS transistor 34 is slightly expanded, and thus the capacitance changes of the same are somewhat increased. In addition, the capacitance of the NMOS transistor 36 also changes with the output voltage. The NMOS transistor 36 is temporarily turned on when the output level is neither 0 nor 1, and is turned off when the output level is 0 or 1. Thus, compared with the circumstance that the control signal Ctrl is logic 0, the NMOS transistor 36 has more capacitance changes caused by temporary turn-on.

As the NAND gate 30 has two input signals as inverted signals, in a steady state, the NMOS transistor 36 in the NAND gate 30 is turned off The steady state here refers to the circumstance when the logic level is 0 or 1. However, when the input signal transits, and the voltage at the input end In of the inverter 31 is approximately equal to the voltage at the output end Out of the inverter 31, the NMOS transistor 36 is slightly turned on, thus resulting in subtle capacitance changes. The transition represents that the input signal is converted from logic level 0 to 1, or from logic level 1 to 0. Comparing FIGS. 9B and 6B, the decrease in the slash areas indicates that capacitance changes are reduced, thereby improving the time resolution.

Figure 10A:
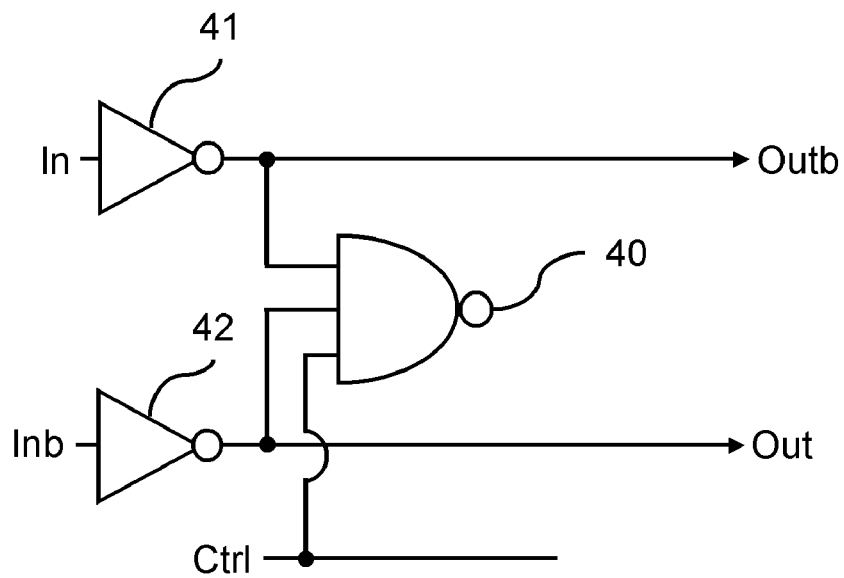
FIGS. 10A and 10B are schematic views of a delay circuit according to a second embodiment of the present invention.

Referring to FIG. 10A, a schematic view of a signal delay circuit according to a second embodiment of the present invention is shown. In this embodiment, an NAND gate 40 serves as a capacitive load element. The NAND gate 40 has a first input end, a second input end, a third input end, and an output end. The first input end of the NAND gate 40 receives a first signal, and the second input end of the NAND gate 40 receives a second signal which is an inverted signal of the first signal. In this embodiment, the first signal and the second signal are input in a differential manner. The first input end of the NAND gate 40 is electrically connected to an output end Outb of a first inverter 41 for receiving the first signal. The second input end of the NAND gate 40 is electrically connected to an output end Out of a second inverter 42 for receiving the second signal. The third input end of the NAND gate 40 receives a control signal Ctrl. The output end of the NAND gate 40 is floating.

After receiving a first input signal through an input end In, the first inverter 41 inverts the first input signal and then outputs the first signal. After receiving a second input signal by an input end Inb, the second inverter 42 inverts the second input signal and then outputs the second signal. The first input signal and the second input signal are differential input signals. The input signals received by the first input end and the second input end of the NAND gate 40 are inverted signals. Thus, the input signals received by the first inverter 41 and the second inverter 42 are also inverted signals.

In this embodiment, the first signal is output by the first inverter 41. The second signal is output by the second inverter 42. Likewise, the second signal is an inverted signal of the first signal.

Figure 10B:
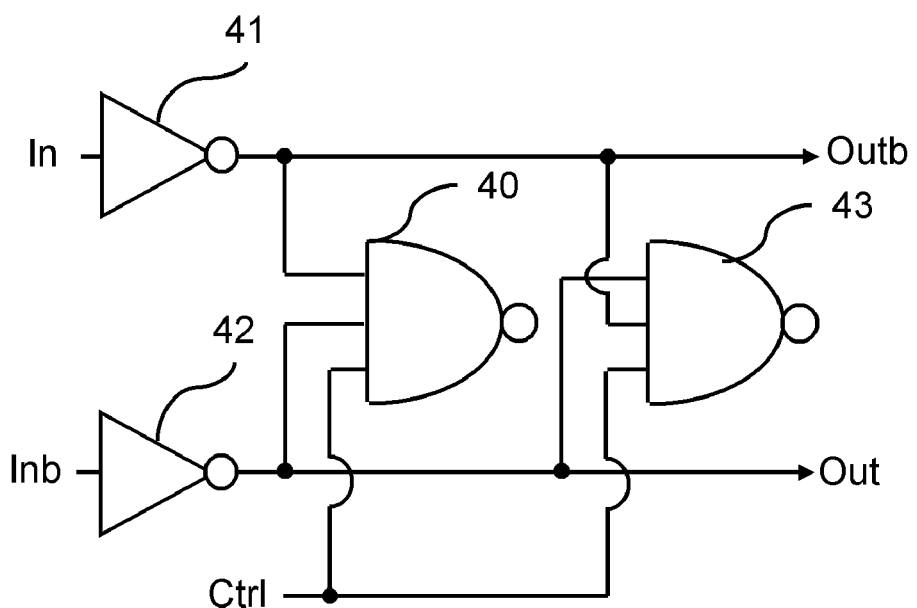

In the above embodiments, a single-stage NAND gate together with an inverter serves as a capacitive load element. However, in other embodiments, two or more sets of NAND gates are employed to constitute a two-stage or above two-stage signal delay circuit, as shown in FIG. 10B, in which an NAND gate 40 and an NAND gate 43 are used. Similarly, the NAND gate 43 has a first input end, a second input end, a third input end, and an output end. The input signal of the NAND gate 43 is input in a differential manner. The first input end of the NAND gate 43 is electrically connected to the output end of the first inverter 41 for receiving a first signal, and the second input end of the NAND gate 43 is electrically connected to the output end of the second inverter 42 for receiving a second signal. The first signal and the second signal are differential input signals. Moreover, the third input end of the NAND gate 43 receives a control signal Ctrl, and the output end of the NAND gate 43 is floating.

Figure 11:
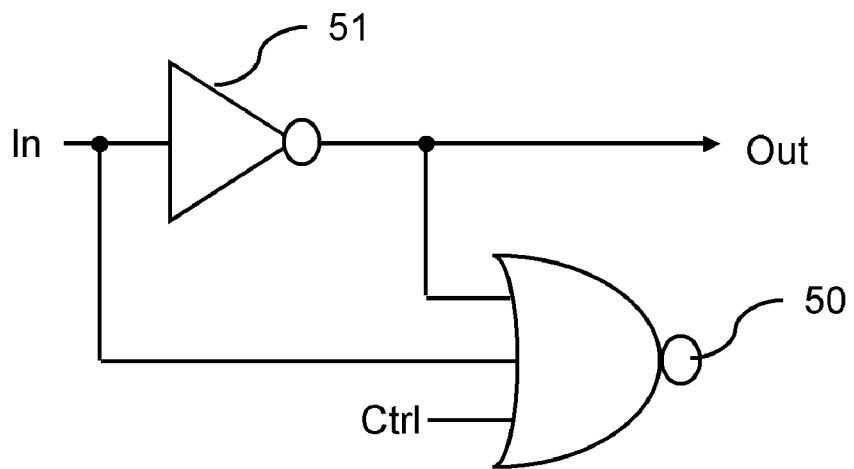
FIG. 11 is a schematic view of a delay circuit according to a third embodiment of the present invention.

Referring to FIG. 11, a schematic view of a signal delay circuit according to a third embodiment of the present invention is shown. In this embodiment, the signal delay circuit consists of a capacitive load element which is an NOR gate 50 in this embodiment. The NOR gate 50 has a first input end, a second input end, a third input end, and an output end. In the NOR gate 50, the first input end receives a first signal, and the second input end receives a second signal which is an inverted signal of the first signal. In this embodiment, the first signal and the second signal are generated by an inverter 51, the first signal is received by an input end In of the inverter 51, and the second signal is output by an output end Out of the inverter 51. The first input end of the NOR gate 50 is electrically connected to the input end of the inverter 51 for receiving the first signal, the second input end of the NOR gate 50 is electrically connected to the output end of the inverter 51 for receiving the second signal, the third input end of the NOR gate 50 receives a control signal Ctrl, and the output end of the NOR gate 50 is floating.

In this embodiment, the second signal is an inverted signal of the first signal. Thus, the first signal is received, then inverted, and output by the inverter 51 to serve as the second signal.

Figure 12:
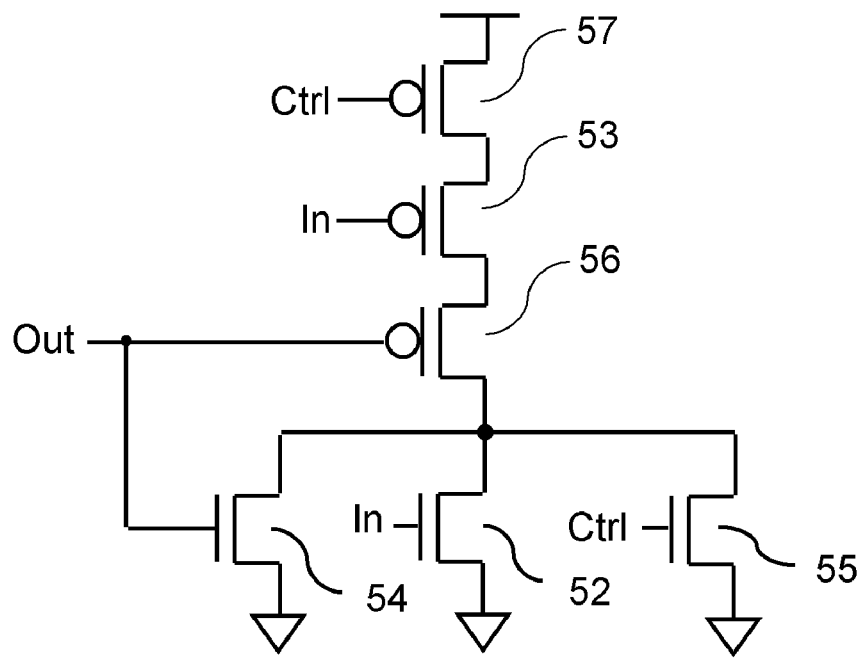
FIG. 12 is an equivalent circuit diagram of the delay circuit in FIG. 11.

FIG. 12 is an equivalent circuit diagram of the NOR gate 50 in FIG. 11. Gates of an NMOS transistor 52 and a PMOS transistor 53 represent the first input end of the NOR gate 50. Gates of an NMOS transistor 54 and a PMOS transistor 56 represent the second input end of the NOR gate 50. Gates of an NMOS transistor 55 and a PMOS transistor 57 represent the third input end of the NOR gate 50.

Figure 13A:
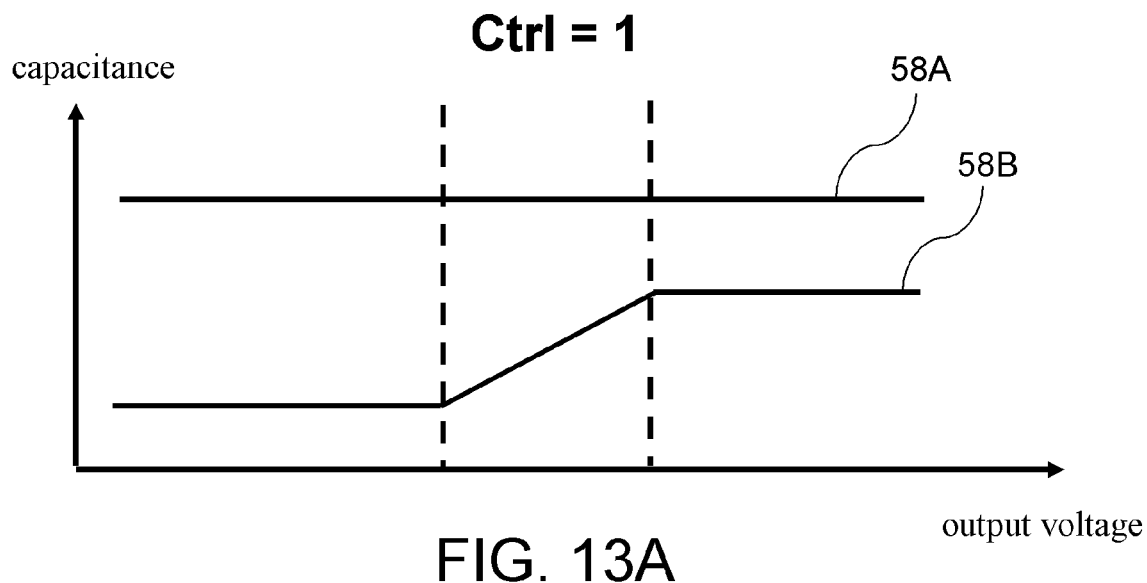
FIGS. 13A and 13B are schematic views showing capacitance changes of the delay circuit in FIG. 11 under different control signals.
Figure 13B:
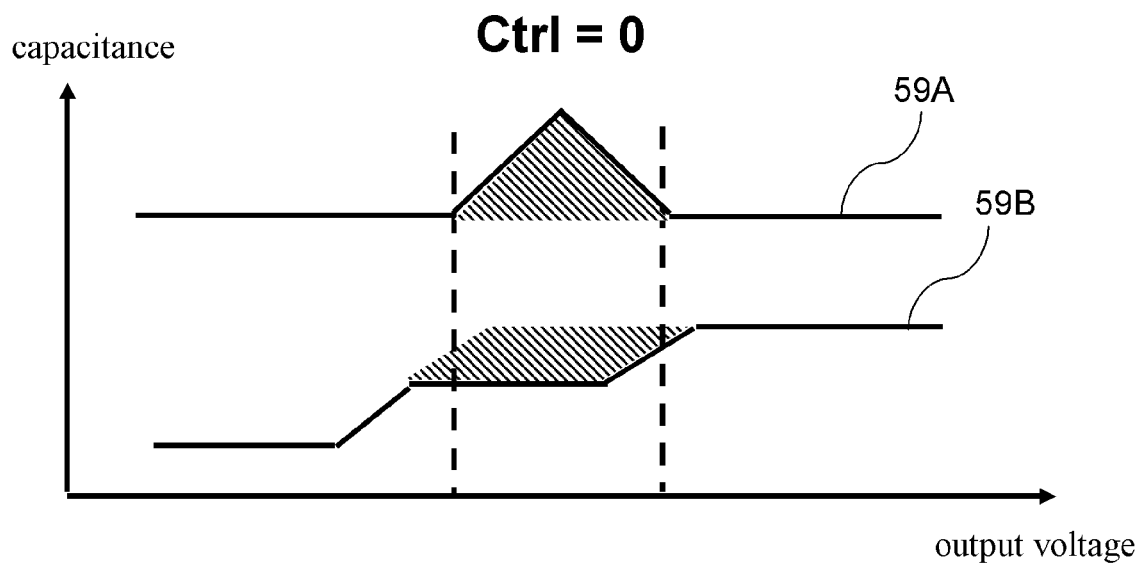

FIGS. 13A and 13B are schematic views showing parasitic capacitance changes at the output end of the inverter 51 caused by the NOR gate 50 under different control signals. In FIG. 13A, when the control signal Ctrl is logic 1, a curve 58A indicates capacitance changes of the PMOS transistor 56, and a curve 58B indicates capacitance changes of the NMOS transistor 54. In FIG. 13B, when the control signal Ctrl is logic 0, a curve 59A indicates capacitance changes of the PMOS transistor 56, and a curve 59B indicates capacitance changes of the NMOS transistor 54.

When the control signal Ctrl is logic 1, no matter the logic level at the output end of the inverter 51 is 1 or 0, the NMOS transistor 55 is turned on, and the PMOS transistor 57 is turned off. Thus, the output logic level of the NOR logic gate 50 is always 0, and the NMOS transistor 54 is turned on when the logic level at the output end of the inverter 51 is 1 and is turned off when the output level of the inverter 51 is 0. As the output logic level of the NOR logic gate 50 is 0, the PMOS transistor 56 cannot be turned on no matter the logic level at the output end of the inverter 51 is 1 or 0. When the control signal Ctrl is logic 0, the NMOS transistor 55 is turned off, and the PMOS transistor 57 is turned on. Moreover, the capacitance of the NMOS transistor 54 changes with the output voltage, which is almost the same as the circumstance when the control signal Ctrl is logic 1, but has the following difference. When the output voltage is neither logic 0 nor 1, the PMOS transistor 56 is slightly turned on, such that the turn-on range of the NMOS transistor 54 is slightly expanded, and thus the capacitance changes of the same are somewhat increased. In addition, the capacitance of the PMOS transistor 56 also changes with the output voltage. The PMOS transistor 56 is temporarily turned on when the output level is neither 0 nor 1, and is turned off when the output level is 0 or 1. Thus, compared with the circumstance that the control signal Ctrl is logic 1, the PMOS transistor 56 has more capacitance changes caused by temporary turn-on.

As the NOR gate 50 has two input signals as inverted signals, in a steady state, the PMOS transistor 56 in the NOR gate 50 is turned off. However, when the input signal transits, and the voltage at the input end of the inverter 51 is approximately equal to the voltage at the output end of the inverter 51, the PMOS transistor 56 is slightly turned on, thus resulting in subtle capacitance changes. Comparing FIGS. 13B and 6B, the decrease in the slash areas indicates that capacitance changes are reduced, thereby improving the time resolution.

Figure 14A:
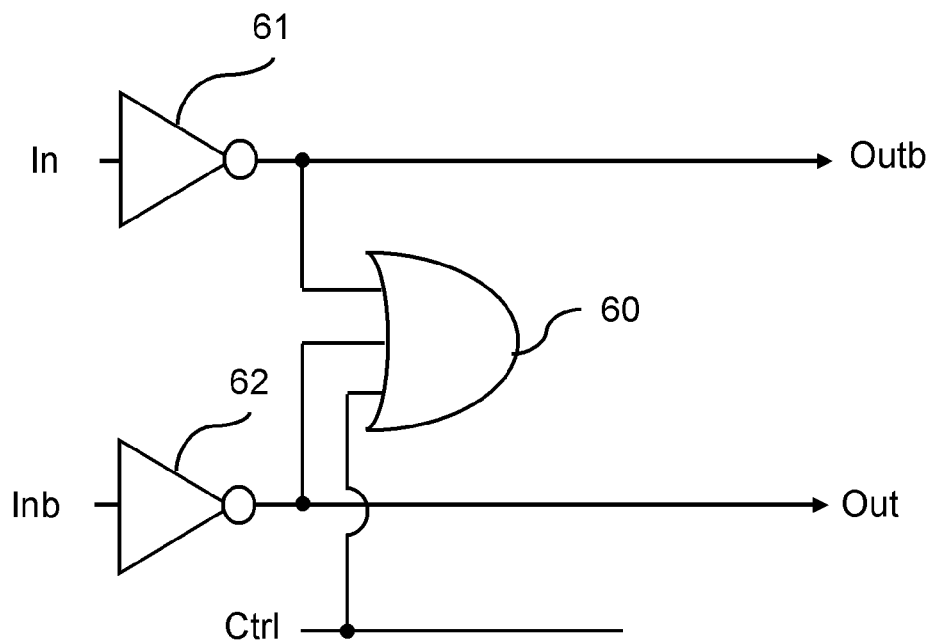
FIGS. 14A and 14B are schematic views of a signal delay circuit according to a fourth embodiment of the present invention.

Referring to FIG. 14A, a schematic view of a signal delay circuit according to a fourth embodiment of the present invention is shown. In this embodiment, an NOR gate 60 serves as a capacitive load element. The NOR gate 60 has a first input end, a second input end, a third input end, and an output end. The first input end of the NOR gate 60 receives a first signal, and the second input end of the NOR gate 60 receives a second signal which is an inverted signal of the first signal. In this embodiment, the first signal and the second signal are input in a differential manner. The first input end of the NOR gate 60 is electrically connected to an output end Outb of a first inverter 61 for receiving the first signal, the second input end of the NOR gate 60 is electrically connected to an output end Out of a second inverter 62 for receiving the second signal, the third input end of the NOR gate 60 receives a control signal Ctrl, and the output end of the NOR gate 60 is floating.

After receiving a first input signal by an input end In, the first inverter 61 inverts the first input signal and then outputs the first signal. After receiving a second input signal by an input end Inb, the second inverter 62 inverts the second input signal and then outputs the second signal. The first input signal and the second input signal are differential input signals. The input signals received by the first input end and the second input end of the NOR gate 60 are inverted signals. Thereby, the input signals received by the first inverter 61 and the second inverter 62 are also inverted signals.

In this embodiment, the first signal is output by the first inverter 61. The second signal is output by the second inverter 62. Similarly, the second signal is an inverted signal of the first signal.

Figure 14B:
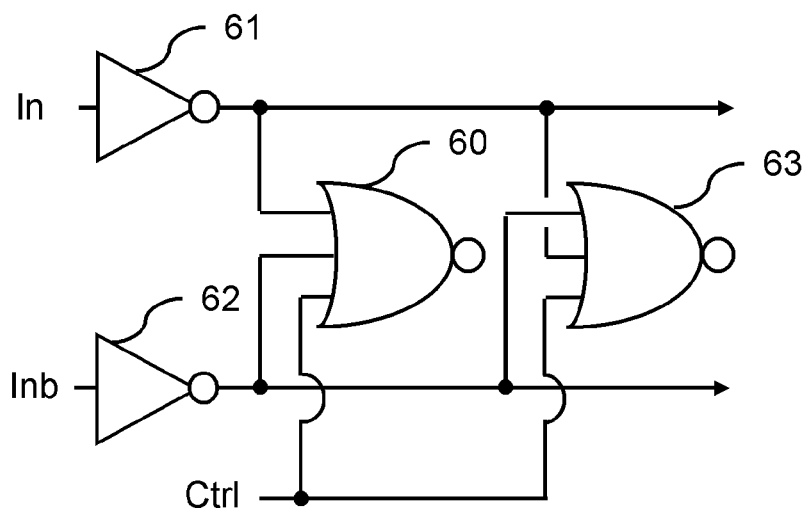

In the above embodiments, a single-stage NOR gate together with an inverter serves as a capacitive load element. However, in other embodiments, two or more sets of NOR gates are employed to constitute a two-stage or above two-stage signal delay circuit, as shown in FIG. 14B, in which an NOR gate 60 and an NOR gate 63 are used. Similarly, the NOR gate 63 has a first input end, a second input end, a third input end, and an output end. The input signal of the NOR gate 63 is input in a differential manner. The first input end of the NOR gate 63 is electrically connected to the output end of the first inverter 61 for receiving a first signal, and the second input end of the NOR gate 63 is electrically connected to the input end of the second inverter 62 for receiving a second signal, in which the first signal and the second signal are differential input signals. Moreover, the third input end of the NOR gate 63 receives a control signal Ctrl, and the output end of the NOR gate 63 is floating.

Figure 3A:
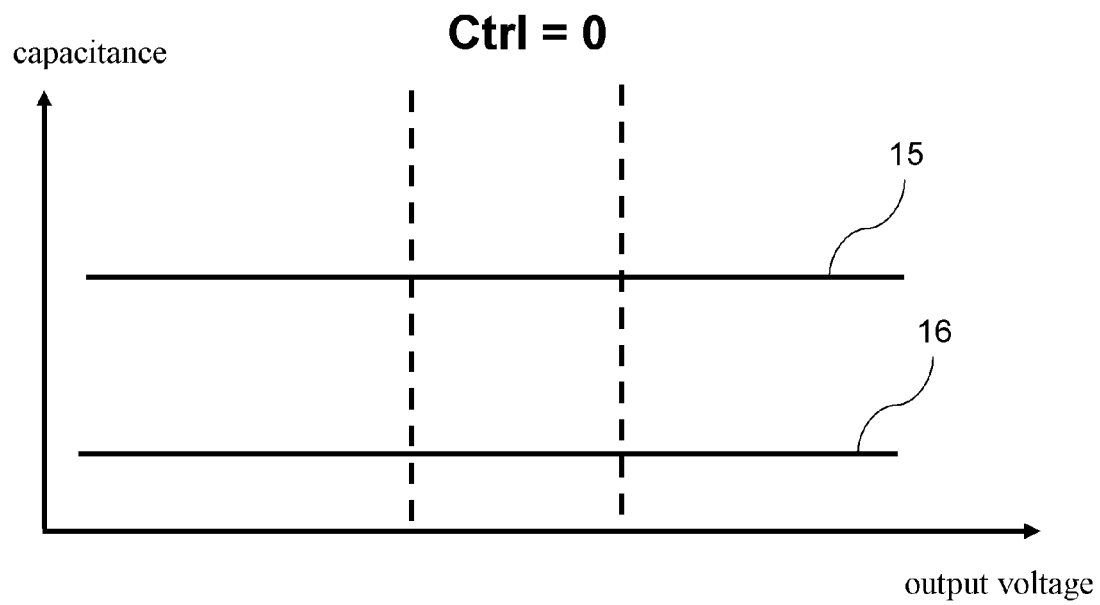
FIGS. 3A and 3B are schematic views showing capacitance changes of the delay circuit in FIG. 1 under different control signals.
Figure 3B:
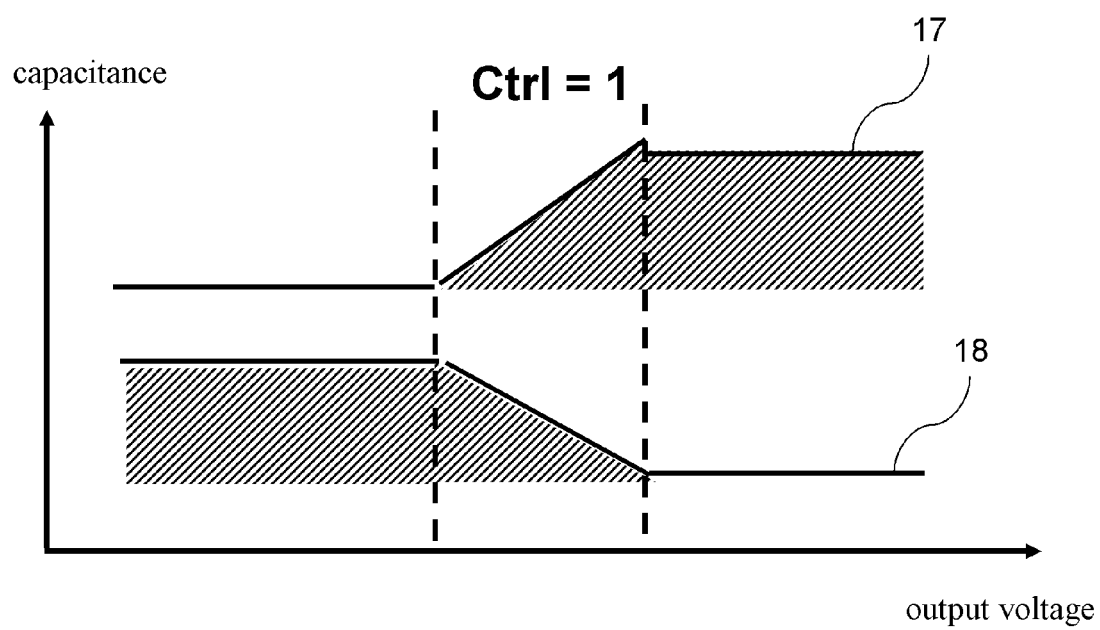
Figure 6A:
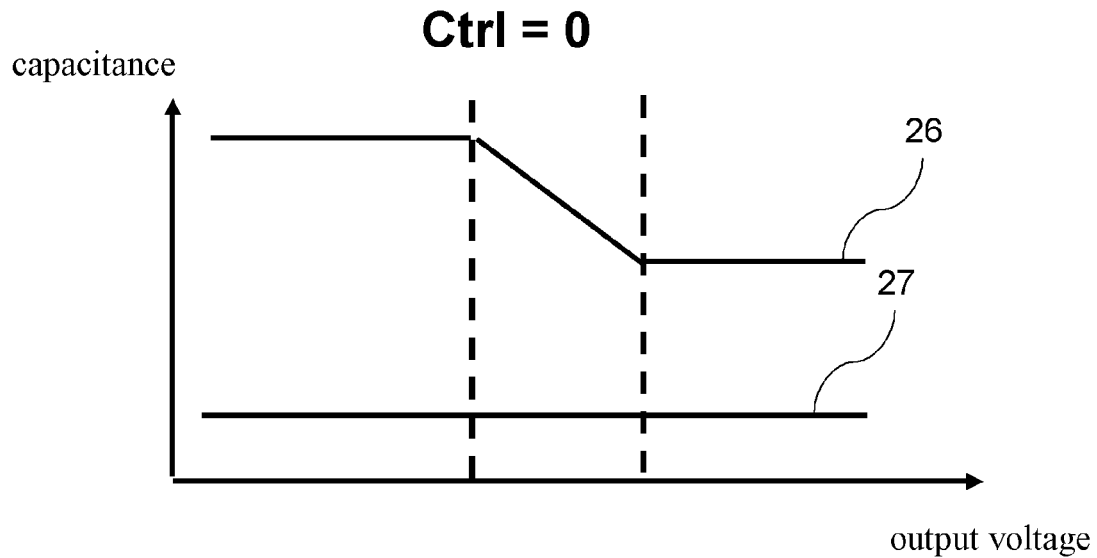
FIGS. 6A and 6B are schematic views showing capacitance changes of the delay circuit in FIG. 4 under different control signals.
Figure 6B:
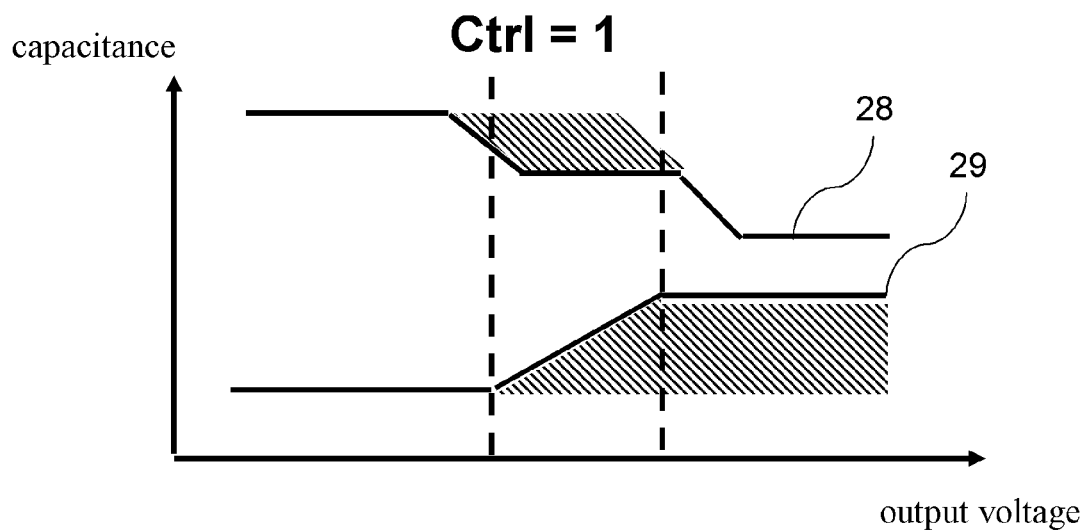
Figure 15:
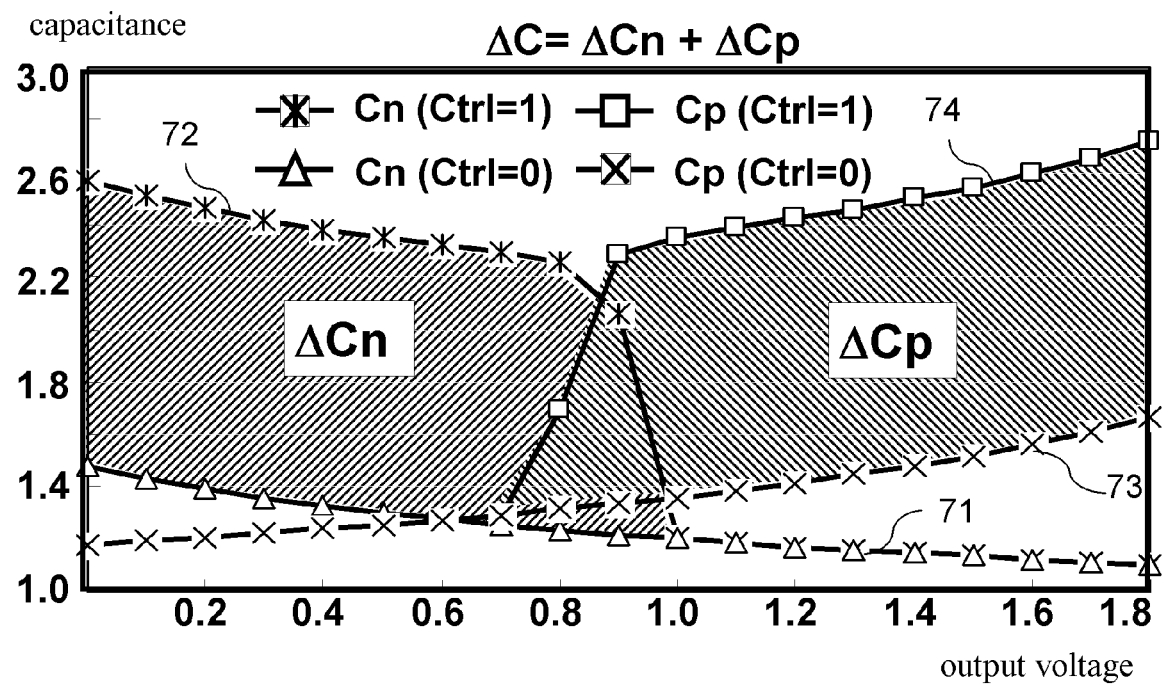
FIG. 15 is a schematic view showing practical verifications of capacitance changes of the delay circuit in FIG. 1.
Figure 16:
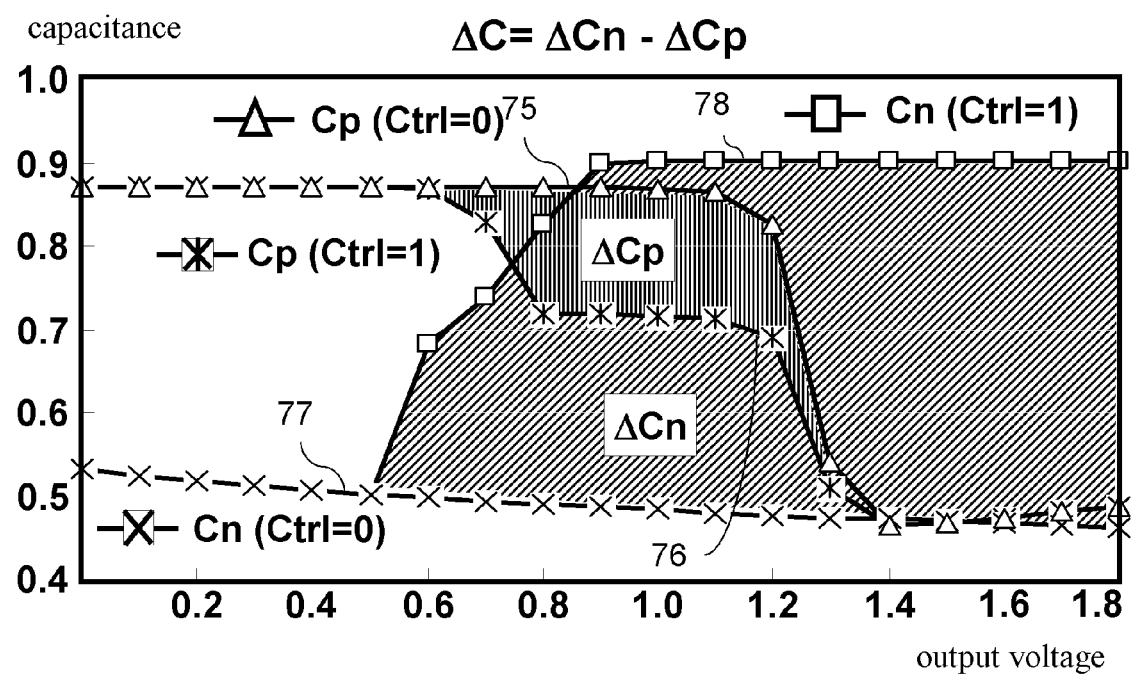
FIG. 16 is a schematic view showing practical verifications of capacitance changes of the delay circuit in FIG. 4.
Figure 17:
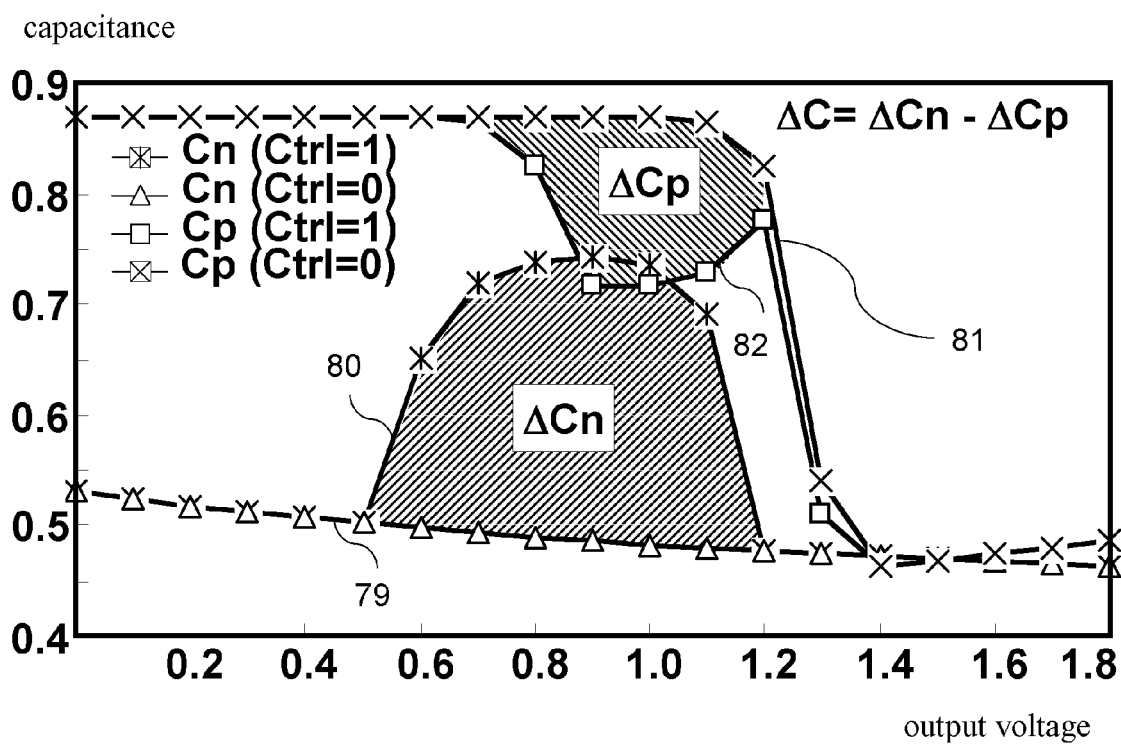
FIG. 17 is a schematic view showing practical verifications of capacitance changes of the delay circuit in FIG. 7.

Referring to FIGS. 15 to 17, practical verifications of capacitance changes of FIGS. 3, 6, and 9 are shown respectively. A 0.18 μm process developed by TSMC is used for simulation, and the width/length ratio (W/L) of all the NMOS in the logic gate is 0.45 μm/0.18 μm, and the width/length ratio (W/L) of all the PMOS in the logic gate is 1.62 μm/0.18 μm, so as to simulate the parasitic capacitances of the NMOS and PMOS transistors at the output end when the output voltage changes from 0 V to 1.8 V.

Figure 1:
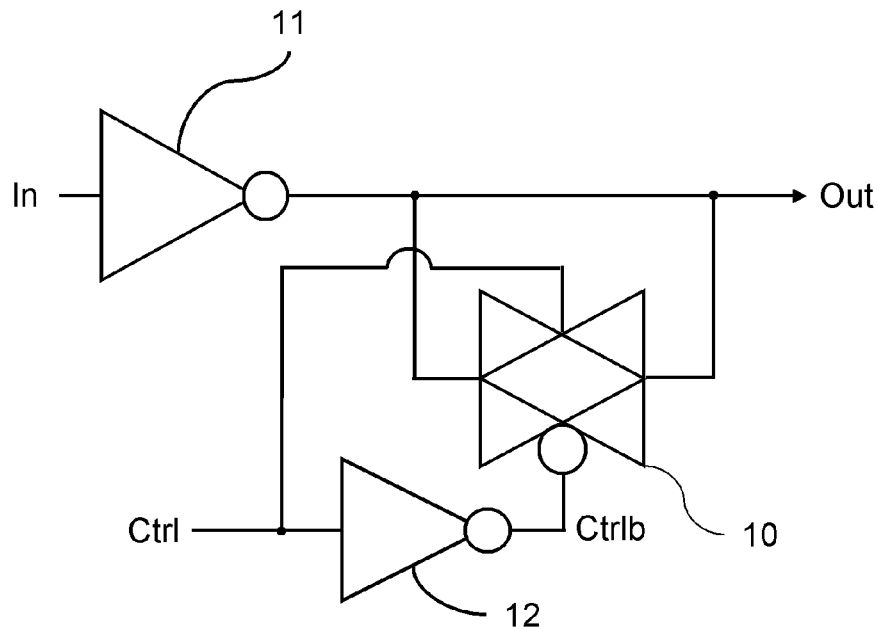
FIG. 1 shows a delay circuit in the prior art.
Figure 2:
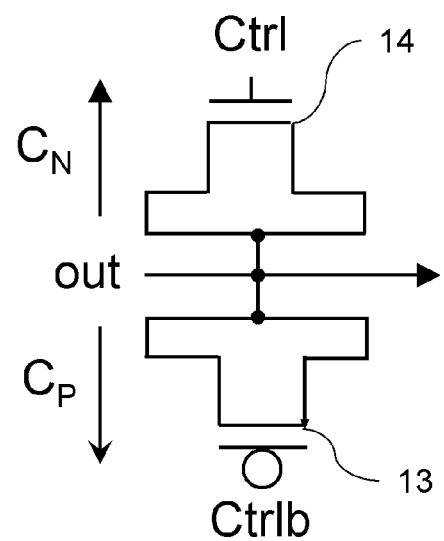
FIG. 2 is an equivalent circuit diagram of the delay circuit in FIG. 1.

In FIG. 15, a curve 71 indicates the parasitic capacitance of the NMOS transistor when the control signal Ctrl is logic 0, a curve 72 indicates the parasitic capacitance of the NMOS transistor when the control signal Ctrl is logic 1, and the change between the two parasitic capacitances is defined as ΔCn. Further, a curve 73 indicates the parasitic capacitance of the PMOS transistor when the control signal Ctrl is logic 0, a curve 74 indicates the parasitic capacitance of the PMOS transistor when the control signal Ctrl is logic 1, and the change between the two parasitic capacitances is defined as ΔCp. Therefore, under different control signals, the change in capacitance of the signal delay circuit in FIG. 1 is ΔC, ΔC=ΔCn+ΔCp.

Figure 4:
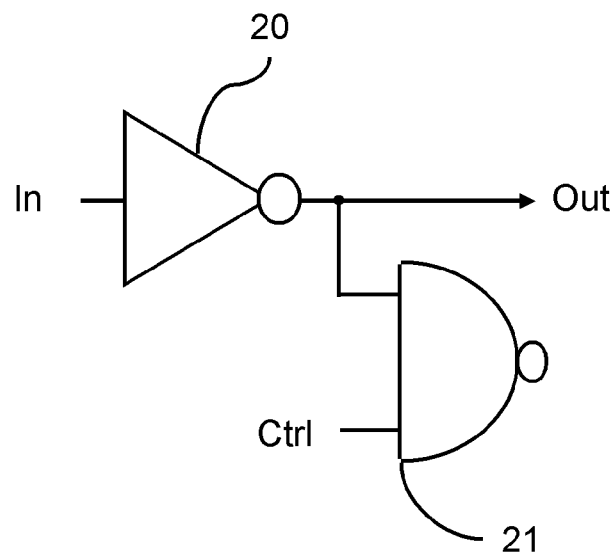
FIG. 4 is a schematic view of another delay circuit in the prior art.
Figure 5:
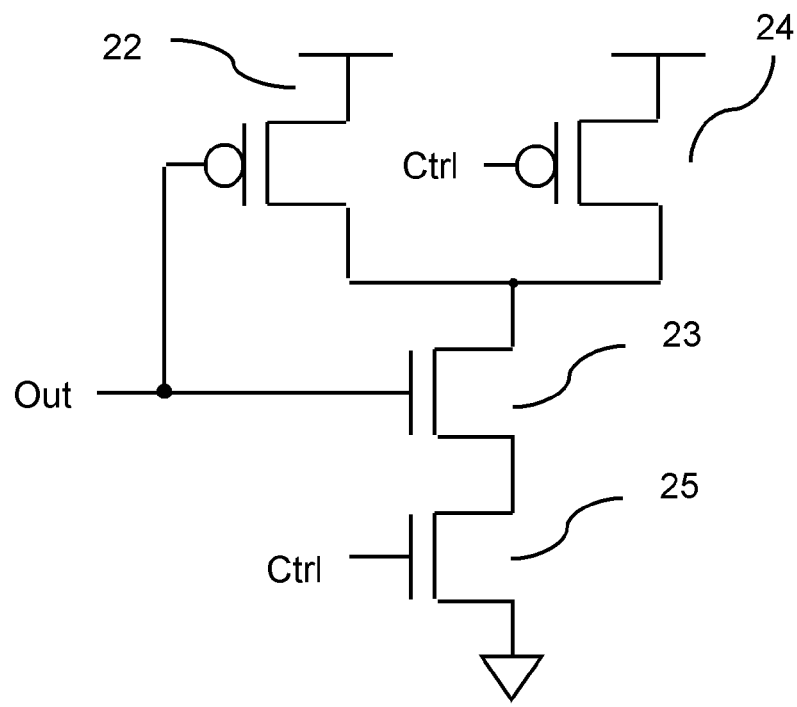
FIG. 5 is an equivalent circuit diagram of the delay circuit in FIG. 4.

In FIG. 16, a curve 75 indicates the parasitic capacitance of the PMOS transistor when the control signal Ctrl is logic 0, a curve 76 indicates the parasitic capacitance of the PMOS transistor when the control signal Ctrl is logic 1, and the change between the two parasitic capacitances is defined as ΔCn. Further, a curve 77 indicates the parasitic capacitance of the NMOS transistor when the control signal Ctrl is logic 0, a curve 78 indicates the parasitic capacitance of the NMOS transistor when the control signal Ctrl is logic 1, and the change between the two parasitic capacitances is defined as ΔCp. Therefore, under different control signals, the change in capacitance of the signal delay circuit in FIG. 4 is ΔC, ΔC=ΔCn−ΔCp.

In FIG. 17, a curve 79 indicates the parasitic capacitance of the NMOS transistor when the control signal Ctrl is logic 0, a curve 80 indicates the parasitic capacitance of the NMOS transistor when the control signal Ctrl is logic 1, and the change between the two parasitic capacitances is defined as ΔCn. Further, a curve 81 indicates the parasitic capacitance of the PMOS transistor when the control signal Ctrl is logic 0, a curve 82 shows the parasitic capacitance of the PMOS transistor when the control signal Ctrl is logic 1, and the change between the two parasitic capacitances is defined as ΔCp. Therefore, under different control signals, the change in capacitance of the signal delay circuit in FIG. 7 is ΔC, ΔC=ΔCn−ΔCp.

Figure 18:
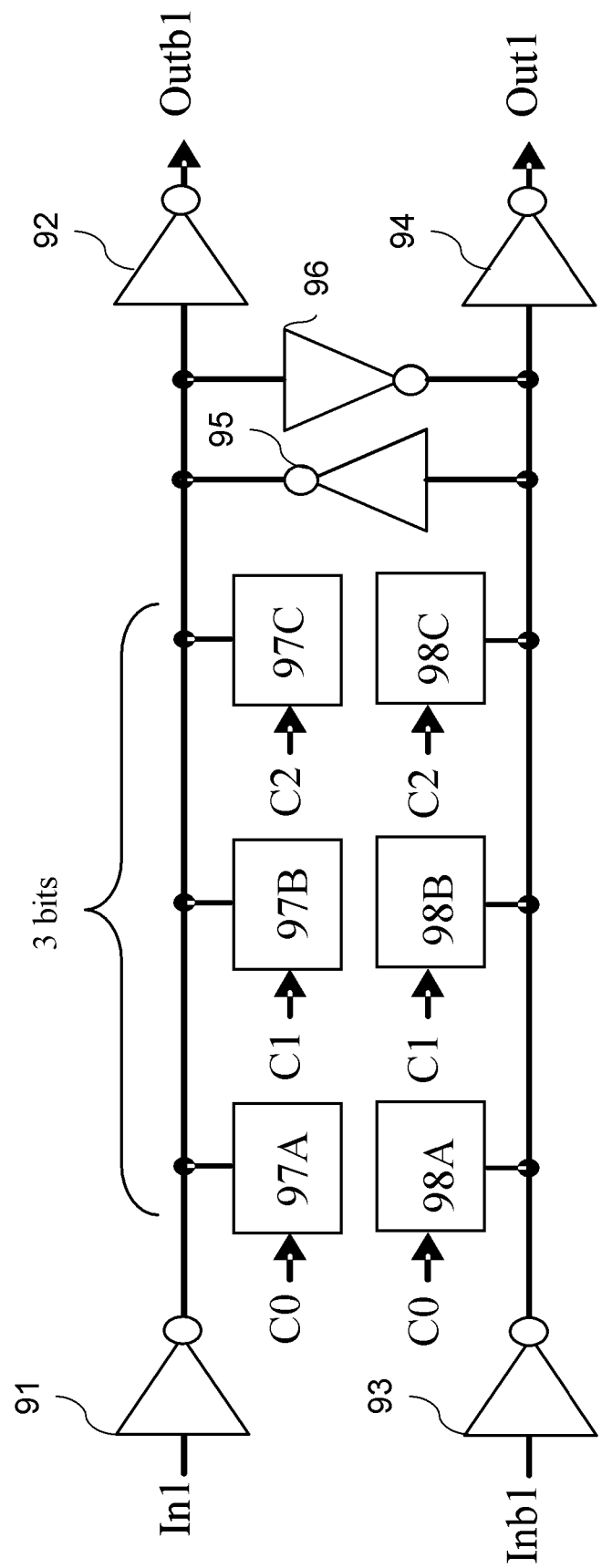
FIG. 18 is a schematic view of an inverter circuit for respectively measuring the resolutions of the circuits in FIGS. 1, 4, and 7.

The resolution of the capacitive load element disclosed in the present invention is verified as follows. Referring to FIG. 18, an inverter circuit is shown, for respectively measuring the resolutions of the circuits in FIGS. 1, 4, and 7. The inverter circuit in FIG. 18 consists of six inverters 91, 92, 93, 94, 95, and 96. An input end In1 of the inverter 91 receives an input signal, an output end Outb1 of the inverter 92 outputs an output signal, an input end Inb1 of the inverter 93 receives an input signal, and an output end Out1 of the inverter 94 outputs an output signal. The output end of the inverter 91 is added with binary three-bit capacitive loads 97A, 97B, and 97C, and the output end of the inverter 93 is also added with binary three-bit capacitive loads 98A, 98B, and 98C. The capacitive loads 97A, 97B, and 97C, 98A, 98B, and 96C adjust the clock delay at the output end through control signals C0, C1, and C2 respectively, such that an adjustable range and a clock resolution can be deduced. The capacitive loads 97A, 97B, and 97C, 98A, 98B, and 98C are respectively achieved by the circuits in FIGS. 1, 4, and 7.

During the test, it is set that the time delay of input signals In1, Inb1 and output signals Outb1, Out1 is Td. As for the size of the inverter, the W/L of the PMOS transistor is 1.62 μm/0.18 μm, and the W/L of the NMOS transistor is 0.45 μm/0.18 μm. As for the sizes of the logic gates, such as the transmission gate 11, NAND gate 20, and NAND gate 30, the W/L of the PMOS transistor is 45 μm/0.18 μm, and the W/L of the NMOS transistor is 0.45 μm/0.18 μm.

When the digital delay circuit in FIG. 1 is under test, the input end and output end of the transmission gate 10 both receive the output signal Out1. When the signal delay circuit in FIG. 4 is under test, the first input end of the NAND gate 21 receives the output signal Out1. When the signal delay circuit in FIG. 7 is under test, the first input end and second input end of the NAND gate 30 respectively receive the output signals Out1, Outb1.

Figures 19A, 19B:
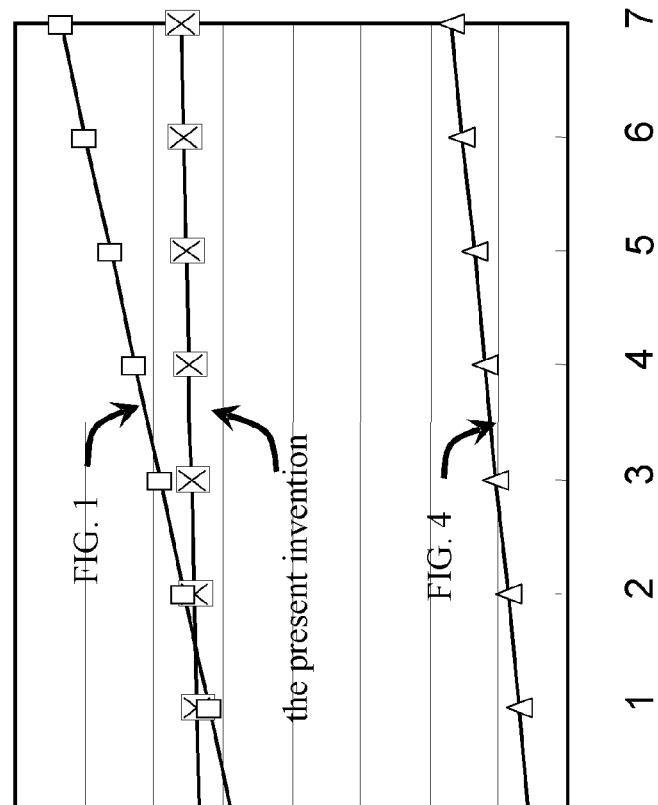
FIG. 19A is a schematic view showing data obtained by measuring the circuits in FIGS. 1, 4, and 7.
FIG. 19B is a schematic view showing particular cases when the control signals in FIG. 19A are logic 000 and 111.

When the control signals sequentially change from logical 000 to 111, data in FIG. 19A and curves in FIG. 19B are obtained. FIG. 19B shows particular cases when the control signals in FIG. 19A are logic 000 and 111, thereby presenting the adjustable range of the three types of architectures. It can be seen from this simulation that, the resolution of FIG. 1 is 3.11 ps, the resolution of FIG. 4 is 1.4 ps, and the resolution of the capacitive load element provided by the present invention reaches 0.33 ps. Therefore, the present invention significantly improves the resolution.

What is claimed is:

1. A signal delay circuit for receiving a first signal and outputting a second signal, the signal delay circuit, comprising:
   a conventional inverter for directly, without any intervening elements, receiving and inverting the first signal, so as to output a completely inverted signal as the second signal; and
   a capacitive load element, having a first input end directly, without any intervening elements, receiving the first signal, a second input end directly, without any intervening elements, receiving the second signal, and a third input end receiving a control signal, wherein the capacitance of the capacitive load element changes with the control signal;
   wherein the transmission delay between the first signal and the second signal is increased with the increase of the capacitance of the capacitive load element.

2. The signal delay circuit as claimed in claim 1, wherein the capacitive load element at least comprises three switches.

3. The signal delay circuit as claimed in claim 1, wherein the capacitive load element is an NAND gate.

4. The signal delay circuit as claimed in claim 3, wherein in a steady state, an N-type transistor in the NAND gate is turned off.

5. The signal delay circuit as claimed in claim 3, wherein when the first signal is approximately equal to the second signal, the N-type transistor in the NAND gate is slightly turned on.

6. The signal delay circuit as claimed in claim 1, wherein the capacitive load element is an NOR gate.

7. The signal delay circuit as claimed in claim 6, wherein in a steady state, an P-type transistor in the NOR gate is turned off.

8. The signal delay circuit as claimed in claim 6, wherein when the first signal is approximately equal to the second signal, the P-type transistor in the NOR gate is slightly turned on.

9. The signal delay circuit as claimed in claim 1, wherein the capacitive load element has a floating output.

10. A signal delay circuit, for receiving a first input signal and a second input signal and outputting a first signal and a second signal, the signal delay circuit, comprising:
    a first conventional inverter, for directly, without any intervening elements, receiving the first input signal so as to output the first signal after completely inverting the first input signal; and a second conventional inverter, for directly, without any intervening elements, receiving the second input signal so as to output the second signal after completely inverting the second input signal, wherein the second signal is an inverted signal of the first signal, and the first input signal and the second input signal are differential input signals; and more than one capacitive load element, each having a first input end directly, without any intervening elements, receiving the first signal, a second input end directly, without any intervening elements, receiving the second signal, and a third input end receiving a control signal, wherein the capacitance of the capacitive load element changes with the control signal.

11. The signal delay circuit as claimed in claim 10, wherein the capacitive load element at least comprises three switches.

12. The signal delay circuit as claimed in claim 10, wherein the capacitive load element is an NAND gate.

13. The signal delay circuit as claimed in claim 12, wherein in a steady state, an N-type transistor in the NAND gate is turned off.

14. The signal delay circuit as claimed in claim 12, wherein when the first signal is approximately equal to the second signal, the N-type transistor in the NAND gate is slightly turned on.

15. The signal delay circuit as claimed in claim 10, wherein the capacitive load element is an NOR gate.

16. The signal delay circuit as claimed in claim 15, wherein in a steady state, an P-type transistor in the NOR gate is turned off.

17. The signal delay circuit as claimed in claim 15, wherein when the first signal is approximately equal to the second signal, the P-type transistor in the NOR gate is slightly turned on.

18. The signal delay circuit as claimed in claim 10, wherein the first input signal and the second input signal are differential input signals.

19. The signal delay circuit as claimed in claim 10, wherein the capacitive load element has a floating output.

* * * * *